(12) United States Patent
Mann

(10) Patent No.: US 6,639,204 B1
(45) Date of Patent: Oct. 28, 2003

(54) SOLID STATE COLOR IMAGER AND METHOD OF MANUFACTURE

(75) Inventor: Richard A. Mann, Torrance, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 101 days.

(21) Appl. No.: 09/900,732

(22) Filed: Jul. 6, 2001

(51) Int. Cl.$^7$ .................................................. G01J 3/50
(52) U.S. Cl. ........................................ 250/226; 257/440
(58) Field of Search .............................. 250/200, 208.1, 250/216, 226; 257/370.01, 371, 10, 11, 21, 53, 113, 184, 225, 257, 290, 414, 431, 291, 440, 451, 443–444, 461; 438/20, 272–273, 263, 259

(56) References Cited

U.S. PATENT DOCUMENTS

| | | | | |
|---|---|---|---|---|
| 4,514,755 A | * | 4/1985 | Tabei | 348/280 |
| 5,298,771 A | * | 3/1994 | Mantell | 257/183.1 |
| 6,369,436 B1 | * | 4/2002 | Gilman | 257/440 |

* cited by examiner

Primary Examiner—David Porta
Assistant Examiner—Patrick J Lee
(74) Attorney, Agent, or Firm—Farjami & Farjami LLP

(57) ABSTRACT

A solid state color imager with preferential response to two or more colors of light includes a first color-selective photoreceptor built in part from a first color-selective semiconductor region limited in depth according to a first color fractional absorption ratio for a first color of light, as well as a second color-selective photoreceptor built in part from a second color-selective semiconductor region limited in depth according to a second color fractional absorption ratio for a second color of light. The imager may provide a light shield above the second color-selective semiconductor region and position the second color-selective photoreceptor in proximity to the first color-selective photoreceptor. The second color-selective photoreceptor may then collect electrons diffusing from the first color-selective photoreceptor and generated by the second color of light. The imager need not include conventional color filters and thus provides a more cost effective color imager for human color vision applications (e.g., digital cameras), as well as machine vision applications with tailored response to selected wavelengths of light other than that recognized by human beings.

36 Claims, 10 Drawing Sheets

| R | G | R | G | R | G |
|---|---|---|---|---|---|
| G | B | G | B | G | B |
| R | G | R | G | R | G |
| G | B | G | B | G | B |
| R | G | R | G | R | G |
| G | B | G | B | G | B |
| R | G | R | G | R | G |
| G | B | G | B | G | B |

SOLID STATE COLOR IMAGER AND METHOD OF MANUFACTURE

BACKGROUND OF THE INVENTION

1. Field of the Invention

This invention relates to electronic imaging devices, and in particular to a solid state color imager, constituent color-selective photoreceptors, and related methods of manufacture.

2. Related Art

Solid-state imagers (simply referred to below as "imagers") find use in a broad range of applications in many distinct fields of technology including the consumer, industrial, medical, defense and scientific fields. Imagers use an array of photodetectors to convert photons bearing image information into an electrical signal indicative of the image. While certain types of imagers may provide only black and white imaging, color imagers are also available.

Conventional color imagers incorporate color filters to control the spectrum of light incident on photodetectors. Thus, for example, FIG. 1 shows a photodiode array 100 of a color imager that includes four identical photodiodes 102, 104, 106, 108. Each photodiode includes a transistor access structure (e.g., the structure 110) that allows a control circuit to precharge its connected photodiode and readout charge from its connected photodiode. The pixel array 100 is configured in a Bayer pattern (i.e., it includes a red, blue, and two green photodetectors arranged in a rectangular pattern). A selected color filter (either red, green, or blue) is disposed above each photodiode in order to allow only light of that color to strike the photodiode. Thus, in FIG. 1, photodiode 102 is responsive to red light, photodiode 104 is responsive to blue light, and photodiodes 106, 108 are responsive to green light because the appropriate type of filter is disposed above each photodetector. The color filters are typically made of photoresist containing dye or pigment.

Convention color filters, however, suffer from numerous drawbacks. For example, the color filters fade with exposure to high levels of heat and light. When the filters fade, the color response of the color detector changes, often undesirably. In addition, color filter aperture effects reduce the amount of light incident on the color filter that makes its way to the photodetector. In some circumstances, the color detector may experience as much as a 50% loss of light response at the edge of the photodetector array when a wide angle lens is employed.

Furthermore, the color filters attenuate incident light by as much as 50%. The attenuation results in degraded color imager performance at low light levels (i.e., the color imager does not function adequately in low light environments). An additional drawback of color filters arises from cross-talk effects. Because the depth of light absorption in silicon is not uniform across the visible spectrum, longer wavelength light (e.g., 600 nm red light) is absorbed deeper in the silicon (as opposed to blue light, for example, which is absorbed closer to the surface). Free carriers that result from photon absorption can diffuse significant distances before recombination or absorption by a photodetector. The diffusion of free electrons from red light absorption is the most severe and can result in more than 50% of the red light response occurring in green and blue photodiodes that are near a red filter.

Thus, a need exists for an improved color imager that addresses the problems noted above and other previously experienced.

SUMMARY

One exemplary implementation of the invention is a photoreceptor with preferential response to a predetermined color of light. The photoreceptor includes a color-selective semiconductor region limited in depth according to a preselected color fractional absorption ratio for the predetermined color of light, and a shallow semiconductor region disposed above the color-selective semiconductor region for absorbing light of wavelengths shorter than the predetermined color of light. As an example, the color-selective semiconductor region may form a first portion of a first photodiode, and the shallow semiconductor region may form a first portion of a second photodiode. Additionally, a deep semiconductor region may be provided below the color-selective semiconductor region for absorbing light of wavelengths longer than the predetermined color. In particular, the photoreceptor may provide preferential response to wavelengths of green light.

Another aspect of the invention is a solid state color imager ("imager") with preferential response to two or more colors of light. The imager includes a first color-selective photoreceptor built in part from a first color-selective semiconductor region limited in depth according to a first color fractional absorption ratio for a first color of light, as well as a second color-selective photoreceptor built in part from a second color-selective semiconductor region limited in depth according to a second color fractional absorption ratio for a second color of light.

Optionally, the imager may provide a light shield (e.g., metalization or another opaque structure) above the second color-selective semiconductor region and position the second color-selective photoreceptor in proximity to the first color-selective photoreceptor. The second color-selective photoreceptor may then collect electrons diffusing from the first color-selective photoreceptor and generated by the second color of light. Where the imager is intended for applications related to human color vision, the first and second colors of light may be, for example, blue and green, blue and red, and/or green and red wavelengths of light. In machine vision applications, the colors of light may correspond to other predetermined wavelengths.

The imager may include additional color-selective photoreceptors selectively responsive to different colors of light. Thus, for example, the imager may further include a third color-selective photoreceptor located in proximity to the first color-selective photoreceptor and the second color-selective photoreceptor. In an imager in which the third color-selective photoreceptor preferentially responds to green wavelengths of light, for example, the third color-selective photoreceptor may include a third color-selective semiconductor region limited in depth according to a preselected color fractional absorption ratio for green light, and either a shallow semiconductor region disposed above the third color-selective semiconductor region for absorbing light of wavelengths shorter than green light and a deep semiconductor region disposed below the third color-selective semiconductor region for absorbing light of wavelengths longer than green light light.

Generally, the first color-selective photoreceptor is one of many first-color selective photoreceptors, the second color-selective photoreceptor is one of many second-color selective photoreceptors, and the third color-selective photoreceptor is one of many third-color selective photoreceptors arranged on a common substrate to form the imager.

The invention also provides a method manufacturing a solid state color imager. First, a first color-selective photoreceptor is fabricated using a first color-selective semiconductor region limited in depth according to a first color fractional absorption ratio for a first color of light. A second color-selective photoreceptor is fabricated in proximity to the first color-selective photoreceptor using a second color-selective semiconductor region limited in depth according to a second color fractional absorption ratio for a second color of light. Optionally, a light shield may be fabricated above the second color-selective semiconductor region, such that the second color-selective photoreceptor collects electrons diffusing from the first color-selective photoreceptor and generated by the second color of light.

In certain implementations, a shallow semiconductor region may be fabricated above the first color-selective semiconductor region for absorbing light with wavelengths shorter than the first color of light, while a deep semiconductor region may be fabricated below the first color-selective semiconductor region for absorbing light of wavelengths longer than the first color of light. Furthermore, additional color-selective photoreceptors for other colors of light may be created, for example, green-selective, red-selective, and blue-selective photoreceptors on a common substrate to form a color imager.

Other implementations, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

FIG. 9 illustrates a solid state color imager.

DETAILED DESCRIPTION OF THE PREFERRED EMBODIMENTS

Before beginning the detailed discussion below, it is first noted that the concept of "color" is not limited to colors interpreted and processed by human physiology (i.e., visible red, green, and blue). Rather, the "color" of light more generally refers to a preselected wavelength or a preselected range of wavelengths in the electromagnetic spectrum. In other words, a photodetector providing preferential response for a particular "color" is not limited to preferential response to the red, green, and blue of human perception. Although an imager, when intended for use in an application associated with human vision (e.g., a digital camera), may include photodetectors tuned to red, green, and blue color response approximating that of the human eye, an imager intended for use in other applications (e.g., machine vision), may include photodetectors tuned to "colors" that do not correspond to the red, green, and blue of human perception. For example, the photodetectors in a machine vision application may be tailored to respond to "colors" that include infrared wavelengths, "colors" that span in wavelength what the human eye considers red, green, or blue, and the like.

Figure 1:
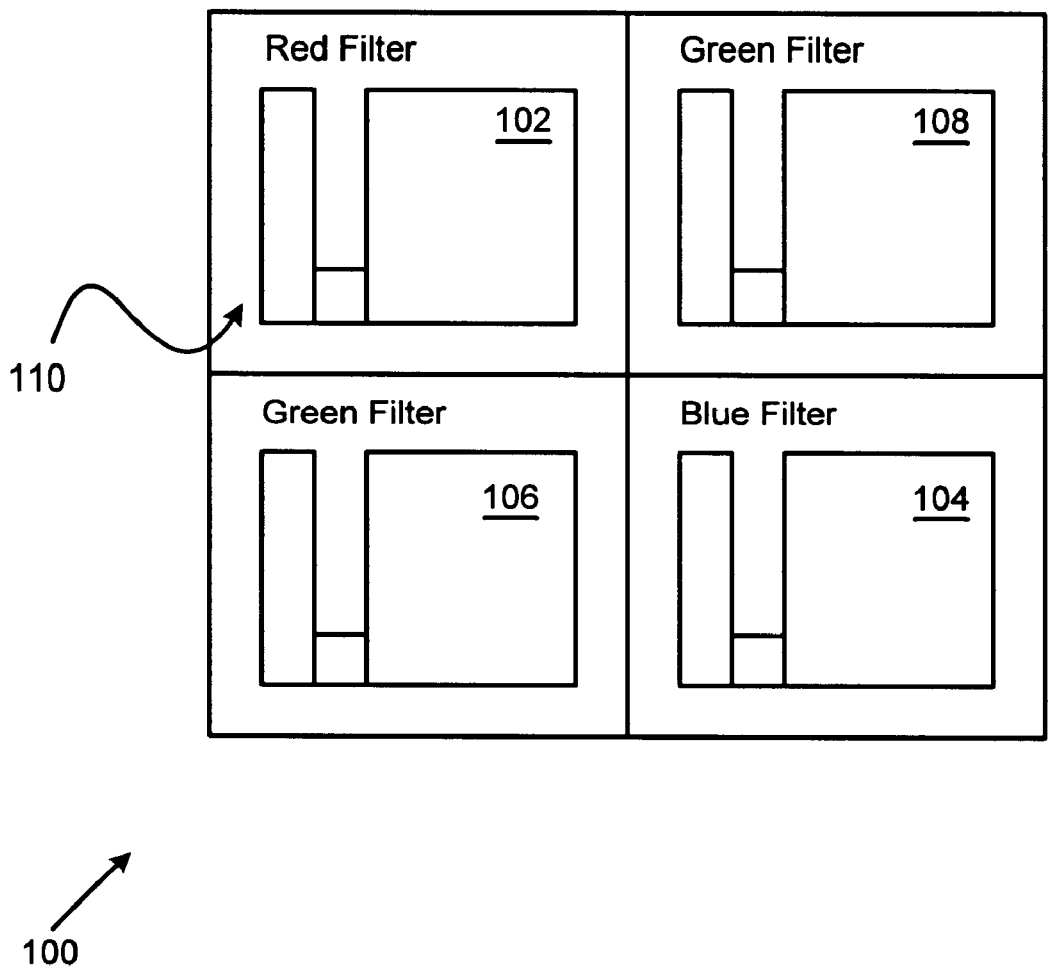
FIG. 1 shows a Bayer Pattern of photodetectors with color filters.
Figure 2:
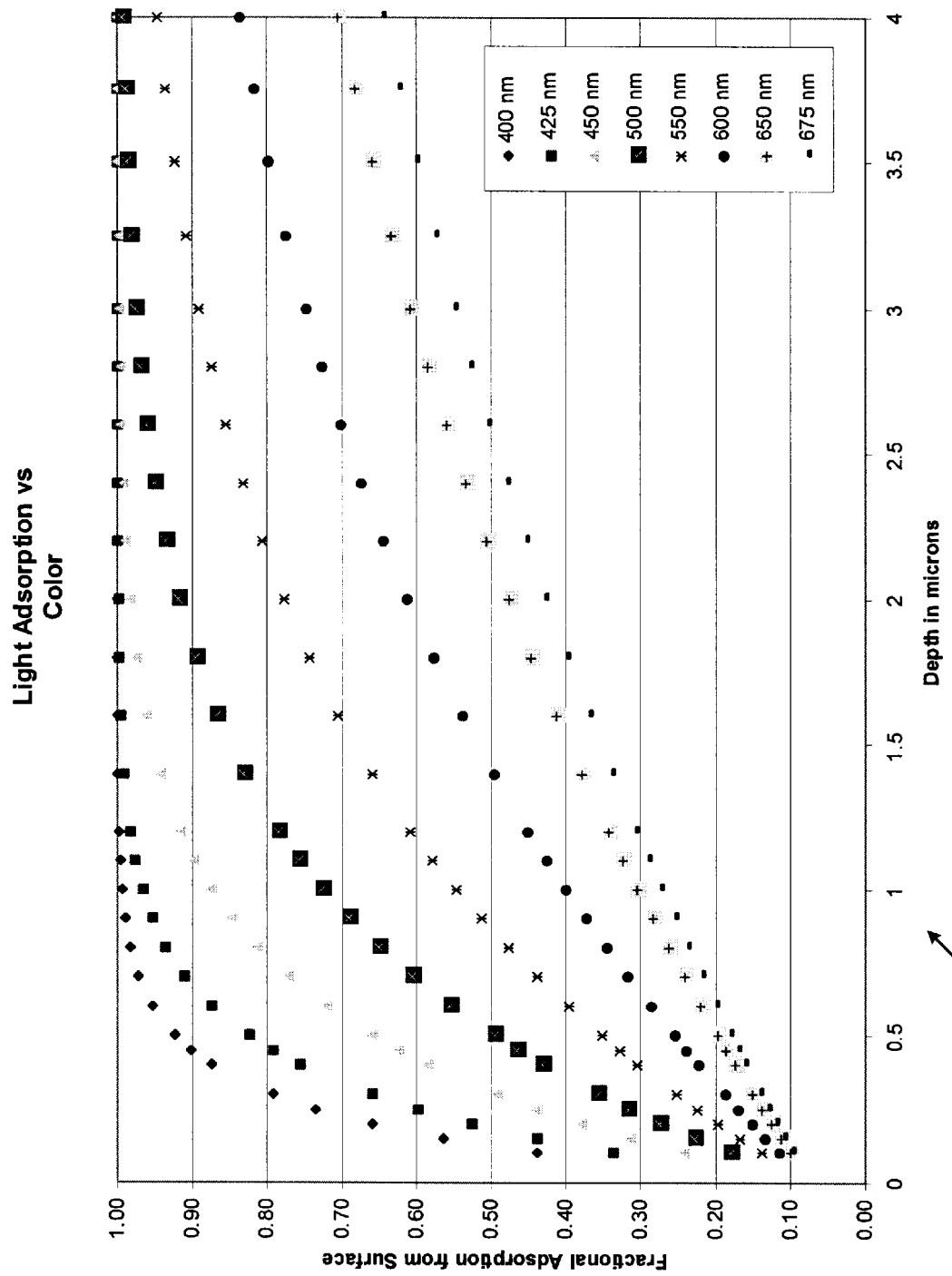
FIG. 2 shows a plot of color fractional absorption ratios for several wavelengths of light.

Turning first to FIG. 2, that figure shows a plot 200 of color fractional absorption ratios for several wavelengths of light (400 nm, 425 nm, 450 nm, 500 nm, 550 nm, 600 nm, 650 nm, and 675 nm). For each wavelength, the plot 200 shows the ratio of light absorbed, with increasing depth, by a semiconductor. For example, approximately 80 percent of light having a wavelength of 425 nm has been absorbed (i.e., converted into electron-hole pairs) when the light has propagated to 0.5 microns into the semiconductor structure. Similarly, 70 percent of light having a wavelength of 450 nm has been absorbed when the light has propagated to 0.5 microns into the semiconductor structure. FIG. 2 illustrates that light of relatively longer wavelength penetrates a semiconductor relatively more deeply before being absorbed. As will be explained in more detail below, the fractional absorption ratios shown in FIG. 2 may be used to design photoreceptors that are selectively responsive to certain wavelengths of light or ranges of wavelengths (e.g., relatively short, intermediate, and long wavelengths).

Figure 3:
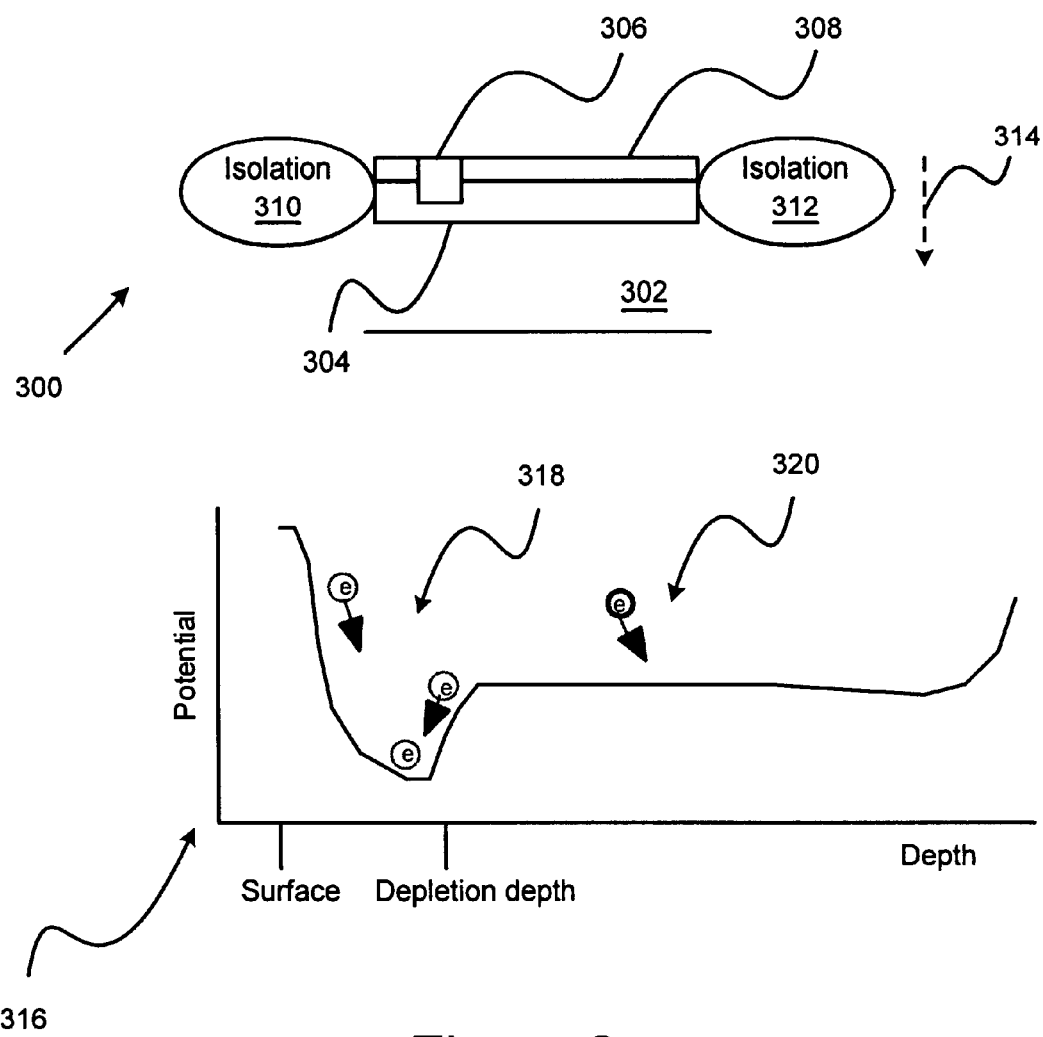
FIG. 3 illustrates a photoreceptor selectively responsive to relatively short wavelengths of light.

Turning now to FIG. 3, that figure illustrates a color-selective photoreceptor 300 fabricated in a substrate 302. The color-selective photoreceptor 300 is implemented as a photodiode including a color selective semiconductor region 304, a receptor contact 306 (which provides a wiring connection to other circuitry), and a complementary portion 308. In the implementation shown in FIG. 3, the color selective semiconductor region 304 is N doped (e.g., with Phosphorous), the receptor contact 306 is N doped (e.g., constructed with an N type lightly doped drain process), and the complementary portion 308 is P doped (e.g., with Boron, or constructed as a P type lightly doped drain process). The photoreceptor 300 is isolated (if desired) from other semiconductor devices on the substrate 302 using the isolation regions 310 and 312.

Generally, the color-selective semiconductor region 304 is selectively limited in the depth direction 314 (measured from the silicon surface on which light is incident) according to a desired response to selected wavelengths of light. More particularly, the color-selective semiconductor region 304 is preferably limited in depth according to a selected fractional absorption ratio for a selected color of light. Thus, for example, for preferential response to blue light (approximately 400 to 500 microns in wavelength), the color selective semiconductor region 304 may be limited in depth to approximately 0.3–0.5 microns. Preferably, the color selective semiconductor region 304 begins as near the surface as possible without actually reaching the surface (other than through the receptor contact 306) to avoid surface leakage effects. However, for applications in which increased junction leakage can be tolerated, the complementary portion 308 may be omitted and the color-selective semiconductor region 304 allowed to contact the semiconductor surface. The latter approach further increases preferential response to short wavelength light.

The limited depth of the color selective semiconductor region 304 allows the photoreceptor 300 to collect electron-hole pairs created by short wavelength light in its potential well, while longer wavelength light penetrates in depth beyond the photoreceptor 300. FIG. 3 also shows an approximate potential profile 316 that shows electrons 318 generated by shorter wavelength light collected by the photoreceptor 300, while electrons 320 generated by longer wavelength are generally deeper than the photoreceptor 300 and lost in the substrate 302. In other words, photoreceptor 300 current is primarily caused by shorter wavelength light, making the photoreceptor 300 preferentially responsive to shorter wavelength light.

Figure 4:
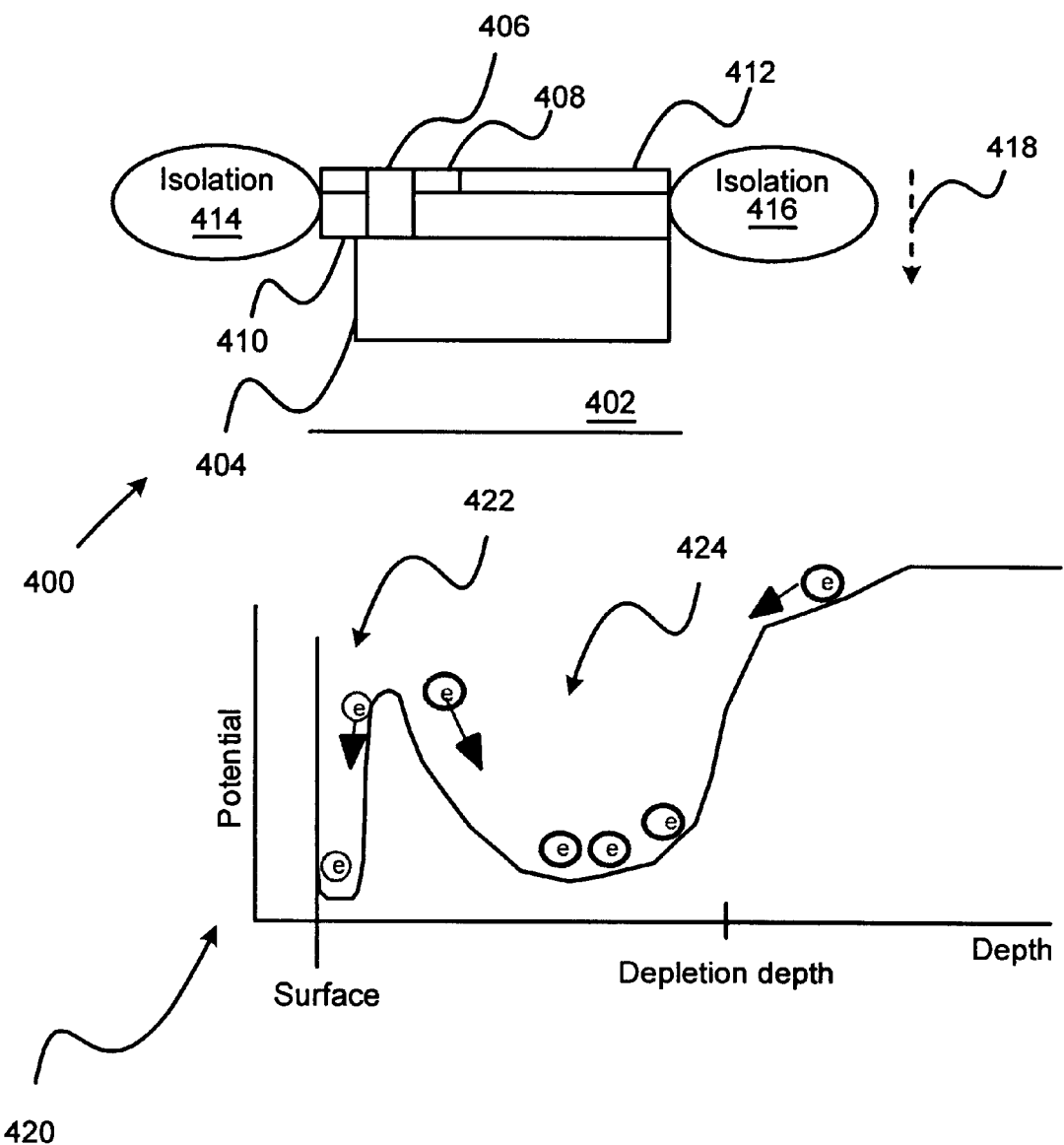
FIG. 4 shows a photoreceptor selectively responsive to intermediate wavelengths of light.

With regard next to FIG. 4, another example of a color-selective photoreceptor 400 fabricated in a substrate 402 is shown. The substrate 402 (and 302) may include a deep P+ profile created, for example, using Boron doping. In particular, the color-selective photoreceptor 400 is implemented as cooperating photodiodes including a color selective semiconductor region 404, a receptor contact 406 (which provides a wiring connection to precharge circuitry, readout circuitry, and the like), a complementary semiconductor region 408, an intermediate semiconductor region 410, and a shallow semiconductor region 412. In the implementation shown in FIG. 4, the color selective semiconductor region 404 is N doped (e.g., with Phosphorous), the receptor contact 406 is N doped (e.g., constructed with an N type lightly doped drain process), the semiconductor regions 408 and 410 are P doped (e.g., with Boron or with semiconductor region 408 constructed using a P type lightly doped drain process). The shallow semiconductor region 412 is P type. The photoreceptor 400 is isolated (if desired) from other semiconductor devices on the substrate 302 using the isolation regions 414 and 416.

The photoreceptor 400 may be conceptualized as a first and a second photodiode working in concert. The first photodiode includes, as a first portion, the color selective semiconductor region 404 and, as a second portion, the intermediate semiconductor region 410. The second photodiode includes, as a first portion, the shallow semiconductor region 412 and, as a second portion, the intermediate semiconductor region 410. The second photodiode operates as described above with reference to FIG. 3 to absorb light of short wavelengths.

Thus, depending on the extent of the color-selective semiconductor region 404 in the depth direction 418, the photoreceptor 400 provides preferential response to relatively longer wavelengths (e.g., the greens and reds of human perception). For example, when the color-selective semiconductor region 404 is approximately 3.0 microns deep, and the shallow semiconductor region is approximately 0.5 microns deep, the photoreceptor 400 provides selective respond to colors of light having wavelengths between approximately 450 nm and 650 nm. The color-selective semiconductor region 404 is limited in depth according to a color fractional absorption ratio to provide a desired response to colors of light in the 450 nm to 650 nm range. In this example (and referring to FIG. 2), when light has penetrated to the bottom of the 3.0 micron deep color-selective semiconductor region 404, the light is (approximately) 60 percent absorbed at 650 nm, 75 percent absorbed at 600 nm, 90 percent absorbed at 550 nm, and almost 100 percent absorbed at 500 nm and 450 nm.

FIG. 4 also depicts an approximate potential profile 420 that shows electrons 422 generated by shorter wavelength light collected by the second photodiode in the photoreceptor 400, while electrons 424 generated by longer wavelength are collected by the first photodiode associated with the color-selective semiconductor region 404.

Figure 5:
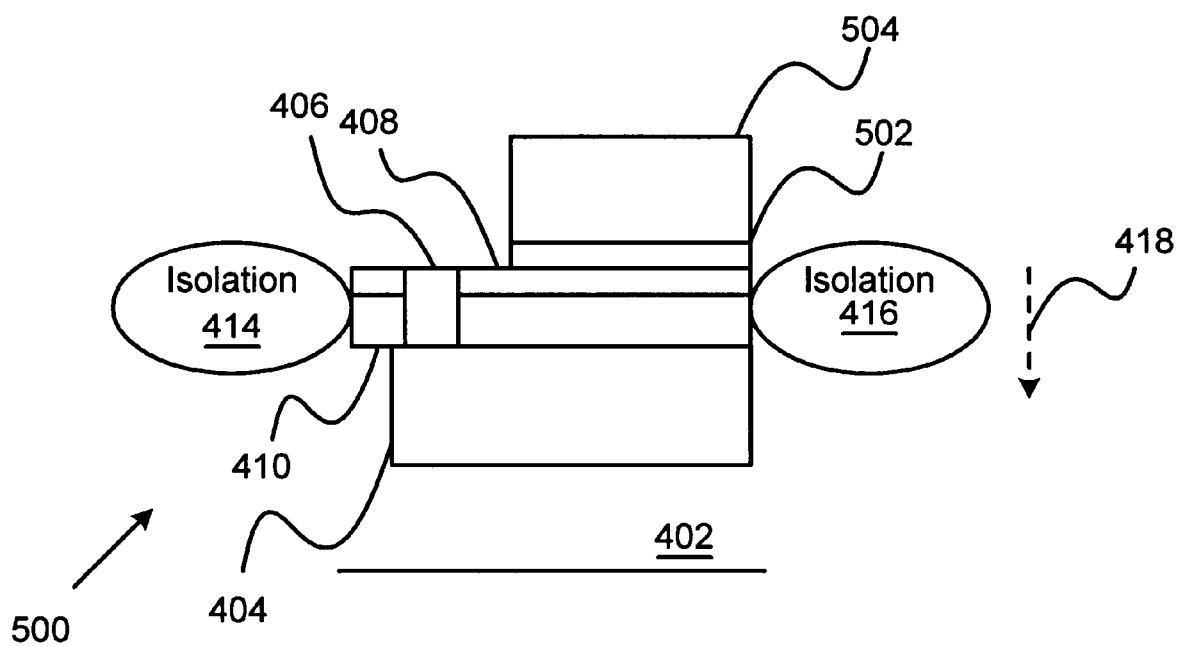
FIG. 5 shows a photoreceptor selectively responsive to intermediate wavelengths of light.

Turning next to FIG. 5, a photoreceptor 500 is shown that is based in part of the photoreceptor 400 in FIG. 4. The photoreceptor 500 eliminates the shallow semiconductor region 412 and instead includes an insulating oxide 502 that supports a color filter 504. The color filter 504 is preferably formed from dyed polysilicon. Thus, for example, the color filter 504 may be dyed such that it absorbs shorter wavelength light. The remaining wavelengths of light then pass into the photoreceptor 500, which, as explained above with respect to FIG. 4, provides preferential response to longer wavelength light using the color-selective semiconductor region 404.

Figure 6:
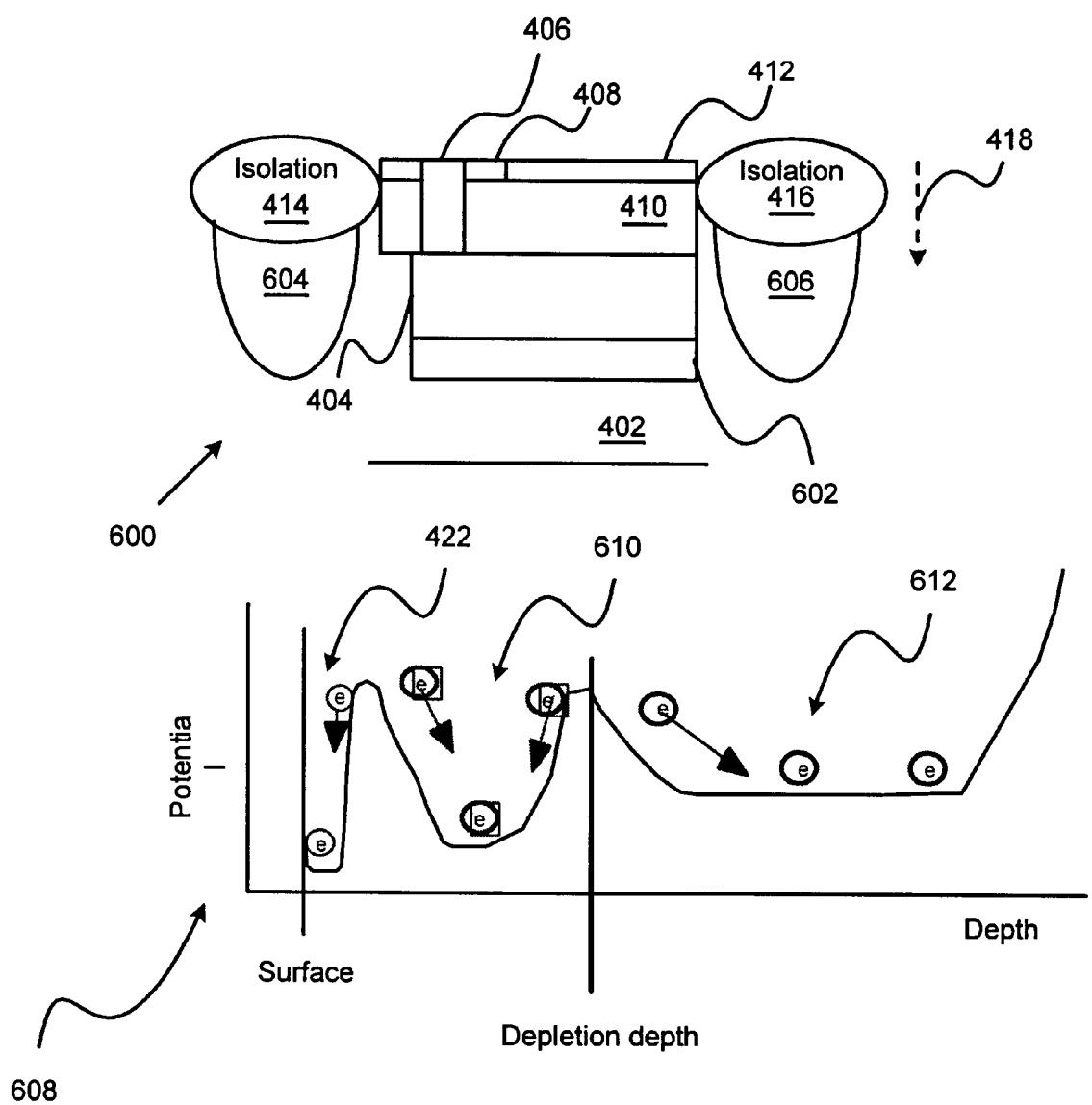
FIG. 6 shows a photoreceptor selectively responsive to intermediate wavelengths of light.

FIG. 6 presents a second photoreceptor based on the underlying design shown in FIG. 4. In particular, the photoreceptor 600 differs from that shown in FIG. 6 by the inclusion of a deep semiconductor region 602 (e.g., a deep Boron implant) underneath the color-selective semiconductor region 404. The photoreceptor 600 achieves narrow response in intermediate wavelengths (e.g., green). To that end, the deep semiconductor region 602 may be limited in depth, as one example, to approximately 1.2 microns, the color-selective semiconductor region 404 may be limited in depth to approximately 1.0 microns, and the shallow semiconductor region 412 may be limited in depth to approximately 0.5 microns. Electron-hole pairs generated by longer wavelength light are captured in the deep semiconductor region 602 under the color-selective semiconductor region 404 (which remains responsive to colors of intermediate wavelength).

Note also that the photoreceptor 600 includes the field implants 604 and 606. The field implants 604 and 606 (doped, for example, with the same material as the deep semiconductor region 602) block electrons that attempt to diffuse to the photoreceptor 600 from neighboring photoreceptors. Because the diffusing electrons tend to be generated by longer wavelength light, the field implants 604 and 606 provided enhanced intermediate color wavelength selectivity for the photoreceptor 600.

FIG. 6 also illustrates an approximate potential profile 608 that shows electrons 422 generated by shorter wavelength light collected by the shallow semiconductor region 412, while electrons 610 generated by intermediate wavelength light are collected by the color-selective semiconductor region 404, and electrons 612 generated by longer wavelength light are collected by the deep semiconductor region 602.

Figure 7:
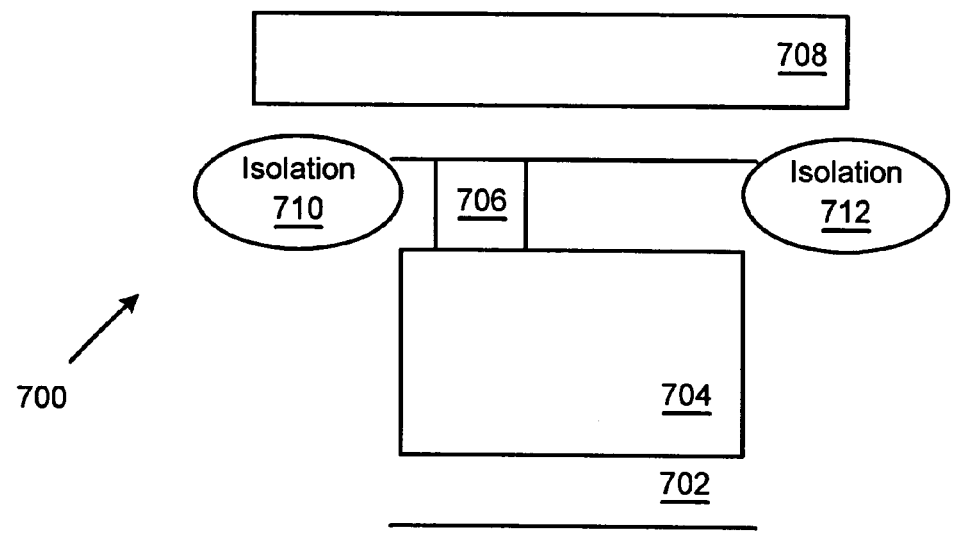
FIG. 7 depicts a photoreceptor selectively responsive to relatively long wavelengths of light.
Figure 7:
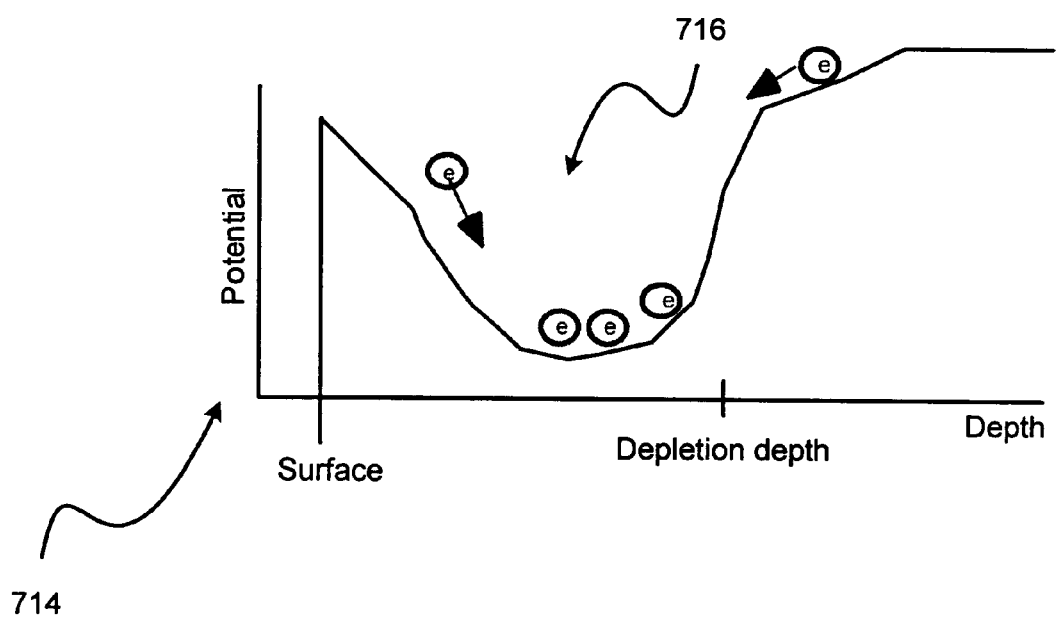

With regard next to FIG. 7, that figure depicts a photoreceptor 700 fabricated in a substrate 702 (that provides, for example, a deep Boron profile) selectively responsive to relatively long wavelengths of light. The photoreceptor 700 includes a color-selective semiconductor region 704 limited in depth according to a predetermined color fractional absorption ratio for longer wavelength (e.g., red) light. The photoreceptor 700 further includes a receptor contact 706 (e.g., made with an N lightly doped drain), an opaque light shield 708, and isolation regions 710 and 712.

The opaque light shield 708 may be fabricated using metalization, for example, to cover the surface of the photoreceptor 700. The opaque light shield 708 prevents incident light from directly penetrating into the photoreceptor 700. Thus, the photoreceptor 700 is instead responsive to electron-hole pairs that diffuse into the photoreceptor 700 from nearby photoreceptors. The nearby photoreceptors are generally tailored to provide selective response to short or intermediate wavelengths of light. Because the diffusing electron-hole pairs are typically generated by long wavelengths light (i.e., the type of light that nearby photoreceptors do not collect), the diffusing electron-hole pairs that reach the photoreceptor 700 cause the photoreceptor 700 to be responsive to longer wavelength light.

For wavelengths corresponding to red light, the color-selective semiconductor region 702 may be limited in depth between 3.0 and 3.5 microns, for example. FIG. 7 also illustrates an approximate potential profile 714 that shows electrons 716 generated by longer wavelength light collected by the photoreceptor 700.

Figure 8:
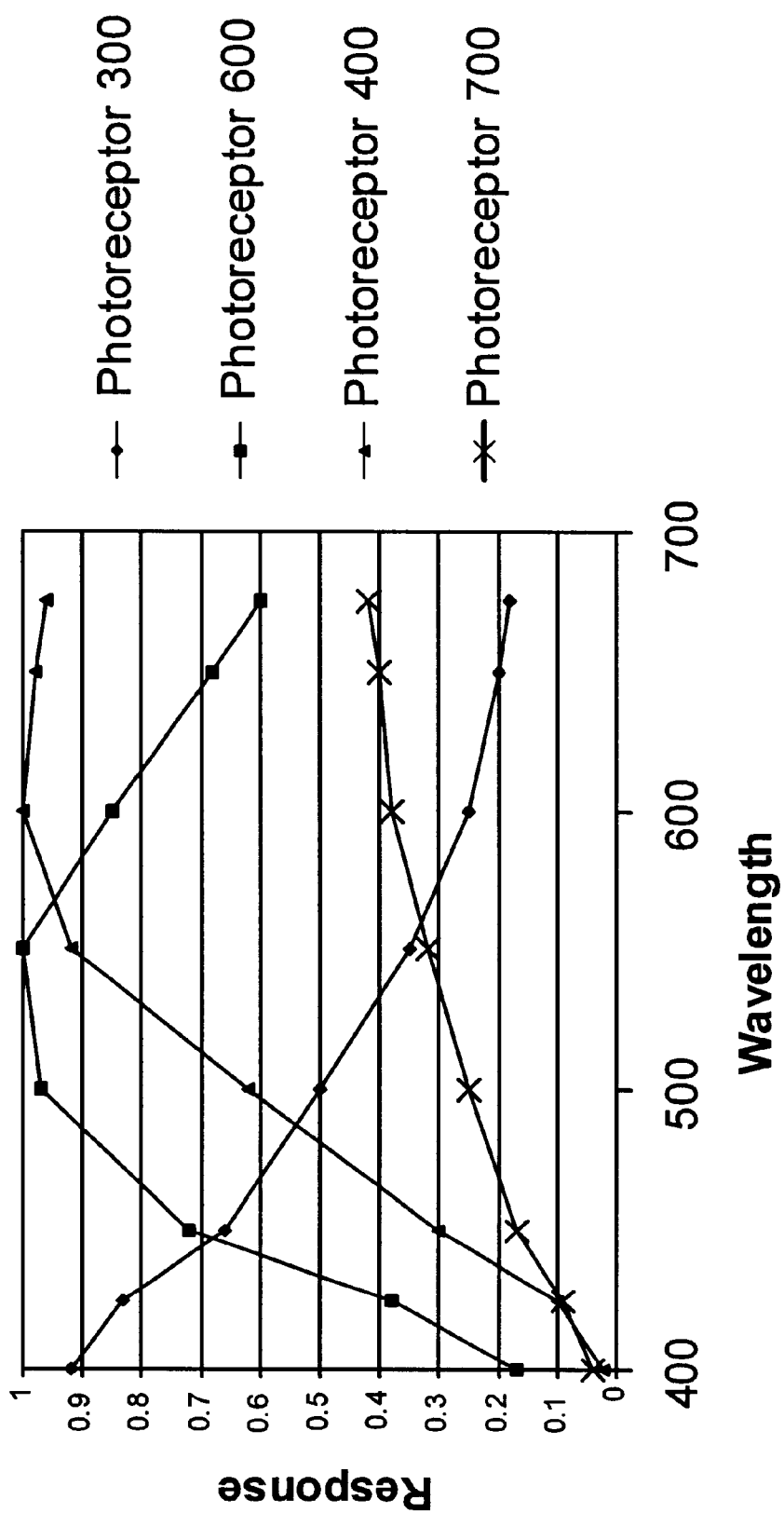
FIG. 8 shows a plot of relative response from four different types of photoreceptors.

Turning next to FIG. 8, that figure shows a plot 800 of wavelength against relative response for four types of photoreceptors. In particular, the plot 800 shows the response of the photoreceptor 300, the photoreceptor 400, the photoreceptor 600, and the photoreceptor 700. The response for the photoreceptor 300 assumes that the color-selective semiconductor region 304 is limited in depth to 0.5 microns. The response for the photoreceptor 400 assumes that the color-selective semiconductor region 404 is limited in depth to 5.0 microns and that the shallow semiconductor region 412 is limited in depth to 0.9 microns. The response for the photoreceptor 600 assumes that the color-selective semiconductor region 404 is limited in depth to 2.2 microns and that the shallow semiconductor region 412 is limited in depth to 0.5 microns.

The plot 800 shows that color information in a scene may be detected by the color-selective photoreceptors described above. The color-selective photoreceptors may thus be used in applications for machine vision, as well as human vision. As a general matter, the length and width of the individual photoreceptors are generally application dependent. For example, the length and width may be tailored to match an amount of space available on a semiconductor substrate. Larger pixels result in fewer pixels per substrate but are characterized by greater light collection (and thus increased signal response). Furthermore, conventional photoresist color filters may be added to the already color-selective photodetectors described above.

Table 1, below, provides an initial comparison of the light filtering effectiveness of ideal color filter response to the estimated performance of the color-selective photodetectors described above. The color-selective photodetectors collect about twice as much total signal as the conventional color filter response. Thus, the color-selective photodetectors may provide superior low light performance. Table 2 shows a comparison using conventional color filters over four identical photodiodes.

TABLE 1 four custom photoreceptors

| Color of Incident Light | Relative response of Photoreceptor 300 | Relative response of Photoreceptor 600 | Relative response of Photoreceptor 400 | Relative response of Photoreceptor 700 |
|---|---|---|---|---|
| 450 nm (blue) | 0.65 | 0.65 | 0.3 | 0.15 |
| 550 nm (green) | 0.4 | 1 | 0.8 | 0.3 |
| 600 nm (red) | 0.25 | 0.85 | 1 | 0.4 |

Adjusted Signal: four Custom Diodes

| Incident light | minus 0.25 | minus 0.65 | minus 0.3 | minus 0.15 |
|---|---|---|---|---|
| 450 nm (blue) | 0.4 | 0 | 0 | 0 |
| 550 nm (green) | 0.15 | 0.35 | 0.5 | 0.15 |
| 600 nm (red) | 0 | 0.25 | 0.7 | 0.25 |

TABLE 2 four color filters over four identical photodiodes

| Color of Incident Light | Relative response of Blue Diode | Relative response of Green Diode | Relative response of RED diode |
|---|---|---|---|
| 450 nm (blue) | 0.78 | 0.05 | 0 |
| 550 nm (green) | 0.05 | 0.6 | 0.05 |
| 600 nm (red) | 0 | 0.05 | 0.9 |

Adjusted Signal: four Custom Diodes

| Incident light | minus 0.05 | minus 0.05 | minus 0.0 |
|---|---|---|---|
| 450 nm (blue) | 0.73 | 0 | 0 |
| 550 nm (green) | 0 | 0.55 | 0.05 |
| 600 nm (red) | 0 | 0 | 0.9 |

Simulation software such as Supreme and Pisces may be used to provide a three dimensional optimization of the photodetector profiles (including depths). Because the color-selective photodetector approach noted above only uses two to three additional masks and implants in the fabrication of an imager, presently the additional cost is only approximately $100 (i.e., substantially less than the fabrication steps for color filters that cost $300 or more). In addition color filters cause a 10 to 15 percent yield loss that adds approximately $200 to the product cost on a per wafer basis. Thus, the cost of production of a color-selective imager using color-selective photodetectors may be 20 to 25% less than that for the color filter approach.

Turning now to FIG. 9, that figure provides a high level block diagram of a portion of a solid state color imager 900 ("the imager 900"). The imager 900 provides preferential response to multiple colors of light using the photoreceptors discussed above. Thus, for example, the imager 900 includes red-selective photoreceptors (marked "R"), green-selective photoreceptors (marked "G"), and blue-selective photoreceptors (marked "B").

The photoreceptors are located in proximity to one another, for example in a Bayer pattern, although other patterns (and color-sensitivities) are also suitable. For example, in a machine vision application, the photoreceptors may be tailored to respond to wavelengths of light expected to radiated from a scene of interest (which may include infrared or other non-human visible wavelengths). The photoreceptors may form an imager using a different pattern of photoreceptors, and the pattern itself may provide more or less sensitivity for selected wavelengths using relatively more or less photoreceptors tailored for those wavelengths.

Figure 10:
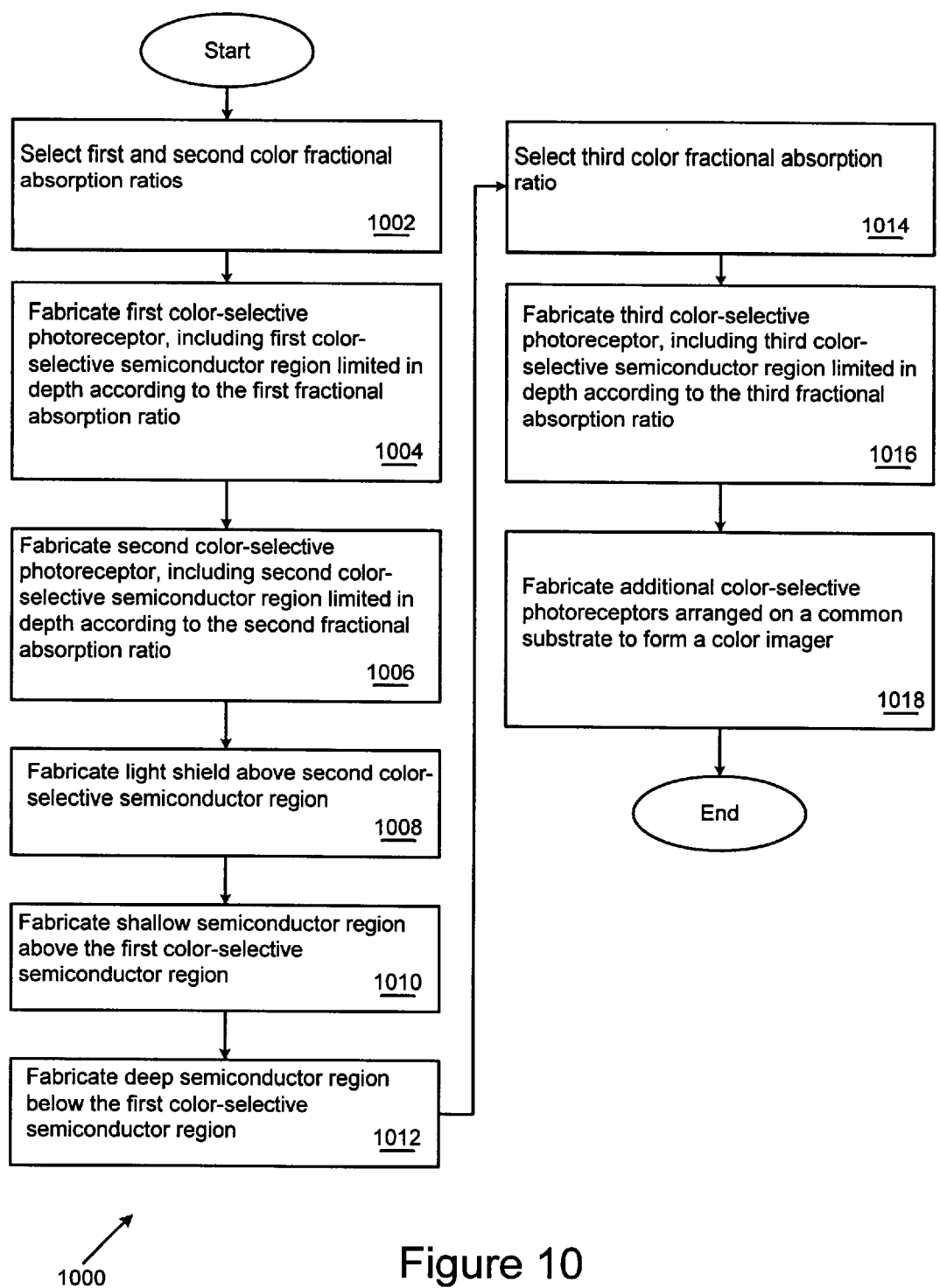
FIG. 10 shows a method for manufacturing a solid state color imager.

With regard next to FIG. 10, that figure summarizes a method 1000 for constructing a solid state color imager. First are second color fractional absorption ratios are initially selected (1002). Next, a first color-selective photoreceptor is fabricated (1004), including a first color-selective semiconductor region limited in depth according to the first color fractional absorption ratio. In other words the photoreceptor is tailored for a first color of light. Similarly, a second color-selective photoreceptor is fabricated (1006) in proximity to the first color-selective photoreceptor, including a second color-selective semiconductor region limited in depth according to the second color fractional absorption ratio.

For selective response to longer wavelengths of light, as discussed above with regard to FIG. 7, a light shield may be fabricated (1008) over one of the color-selective semiconductor regions. Additionally, in certain implementations as discussed above with regard to FIGS. 4 and 6, a shallow semiconductor region may be fabricated (1010) and a deep semiconductor region may be fabricated (1012) to provide enhanced response to intermediate wavelengths of light.

Through the selection of additional color fractional absorption ratios (1014), additional color-selective photoreceptors may be fabricated (1016). In general, the color-selective photoreceptors, when fabricated, are arranged on a common substrate to form a color imager (1018).

The color imager design is formulated to include several (e.g., two to four) different types of photoreceptors. Each of the photoreceptors has a different construction to allow that photoreceptor to respond preferentially to a selected band of wavelengths. In general, the photoreceptors are fabricated and characterized for the selected spectral response using the doping profiles described above. The selection of photoreceptors is driven by the goals and constraints of the color imager, and thus may vary widely from implementation to implementation.

In constructing the photoreceptors, a set of masks are used to give each photoreceptor an appropriate implant to form the junction doping profiles shown above in FIGS. 3–7. In addition, simulation tools may be used to verify that the expected doping profiles would result from the combination of mask, implant, and diffusion of the dopants. Existing heating process steps may be used to diffuse the dopants, though additional heat cycles may be added as needed. There is no specific order in which the fabrication steps need to occur; there are multiple process flows that achieve the designed results.

While various implementations of the application have been described, it will be apparent to those of ordinary skill in the art that many more implementations (e.g., using phototransistors rather than photodiodes) are possible that are within the scope of this invention. Accordingly, the invention is not to be restricted except in light of the attached claims and their equivalents.

What is claimed is:

1. A photoreceptor with preferential response to a predetermined color of light, the photoreceptor comprising:
   a color-selective semiconductor region limited in depth according to a preselected color fractional absorption ratio for the predetermined color of light; and
   a shallow semiconductor region disposed above the color-selective semiconductor region for absorbing light of wavelengths shorter than the predetermined color of light.

2. A photoreceptor according to claim 1, wherein the color-selective semiconductor region forms a first portion of a first photodiode.

3. A photoreceptor according to claim 2, wherein the shallow semiconductor region forms a first portion of a second photodiode.

4. A photoreceptor according to claim 3, further comprising a deep semiconductor region disposed below the color-selective semiconductor region for absorbing light of wavelengths longer than the predetermined color.

5. A photoreceptor according to claim 3, wherein the color of light corresponds to wavelengths of green light, and the color-selective semiconductor region is limited in depth between 0.5 and 2 microns.

6. A photoreceptor according to claim 3, further comprising an intermediate semiconductor region between the shallow semiconductor region and the color-selective semiconductor region, wherein the intermediate semiconductor region forms a second portion of the first photodiode and a second portion of the second photodiode.

7. A solid state color imager with preferential response to at least two colors of light, the imager comprising:
   a first color-selective photoreceptor comprising a first color-selective semiconductor region limited in depth according to a first color fractional absorption ratio for a first color of light; and
   a second color-selective photoreceptor comprising a second color-selective semiconductor region limited in depth according to a second color fractional absorption ratio for a second color of light.

8. A solid state color imager according to claim 7, further comprising a light shield above the second color-selective semiconductor region, the second color-selective photoreceptor located in proximity to the first color-selective photoreceptor for collecting electrons diffusing from the first color-selective photoreceptor and generated by the second color of light.

9. A solid state color imager according to claim 8, wherein the light shield comprises metalization.

10. A solid state color imager according to claim 7, wherein the first and second colors of light correspond to blue and green, blue and red, and green and red wavelengths of light.

11. A solid state color imager according to claim 7, wherein the first color-selective photoreceptor further comprises a shallow semiconductor region disposed above the first color-selective semiconductor region for absorbing light of wavelengths shorter than the first color of light.

12. A solid state color imager according to claim 7, further comprising a deep semiconductor region disposed below the first color-selective semiconductor region for absorbing light of wavelengths longer than the first color of light.

13. A solid state color imager according to claim 11, wherein the first color of light corresponds to wavelengths of green light.

14. A solid state color imager according to claim 7, further comprising a third color-selective photoreceptor located in proximity to the first color-selective photoreceptor and the second color-selective photoreceptor, the third color-selective photoreceptor comprising:
   a third color-selective semiconductor region limited in depth according to a preselected color fractional absorption ratio for a third color of light; and at least one of:
   a shallow semiconductor region disposed above the third color-selective semiconductor region for absorbing light of wavelengths shorter than the third color of light and a deep semiconductor region disposed below the third color-selective semiconductor region for absorbing light of wavelengths longer than the third color of light.

15. A solid state color imager according to claim 14, wherein the third color of light corresponds to wavelengths of green light.

16. A solid state color imager according to claim 7, wherein the first color-selective photoreceptor is one of a plurality of first-color selective photoreceptors, the second color-selective photoreceptor is one of a plurality of second-color selected photoreceptors, and wherein the plurality of first-color photoreceptors and the plurality of second-color photoreceptors are arranged in a predetermined pattern on a common substrate.

17. A solid state color imager according to claim 14, wherein the first color-selective photoreceptor is one of a plurality of first-color selective photoreceptors, the second color-selective photoreceptor is one of a plurality of second-color selected photoreceptors, the third color-selective photoreceptor is one of a plurality of third-color selective photoreceptors, and wherein the plurality of first-color photoreceptors the plurality of second-color photoreceptors, and the plurality of third-color photoreceptors are arranged in a predetermined pattern on a common substrate.

18. A method for manufacturing a solid state color imager, the method comprising:
   creating a first color-selective photoreceptor by fabricating a first color-selective semiconductor region limited in depth according to a first color fractional absorption ratio for a first color of light; and
   creating a second color-selective photoreceptor in proximity to the first color-selective photoreceptor by fabricating a second color-selective semiconductor region limited in depth according to a second color fractional absorption ratio for a second color of light.

19. A method as claimed in claim 18, further comprising:
   fabricating a light shield above the second color-selective semiconductor region, and wherein the second color-selective photoreceptor is created in proximity to the first color-selective photoreceptor for collecting electrons diffusing from the first color-selective photoreceptor and generated by the second color of light.

20. A method according to claim 19, wherein fabricating a light shield comprises fabricating metalization above the second color-selective semiconductor region.

21. A method according to claim 18, further comprising fabricating a shallow semiconductor region above the first color-selective semiconductor region for absorbing light of wavelengths shorter than the first color of light.

22. A method according to claim 18, further comprising fabricating a deep semiconductor region disposed below the first color-selective semiconductor region for absorbing light of wavelengths longer than the first color of light.

23. A method according to claim 18, further comprising creating a third color-selective photoreceptor located in proximity to the first color-selective photoreceptor and the second color-selective photoreceptor by fabricating:
   a third color-selective semiconductor region limited in depth according to a preselected color fractional absorption ratio for a third color of light; and at least one of:
      a shallow semiconductor region disposed above the third color-selective semiconductor region for absorbing light of wavelengths shorter than the third color of light and a deep semiconductor region disposed below the third color-selective semiconductor region for absorbing light of wavelengths longer than the third color of light.

24. A solid state color imager according to claim 23, wherein creating a first color-selective photoreceptor comprises creating a plurality of first color-selective photoreceptors, creating a second color-selective photoreceptor comprises creating a plurality of second color-selective photoreceptors, and creating a third color-selective photoreceptor comprises creating a plurality of third color-selective photoreceptors arranged on a common substrate to form a color imager.

25. A solid state imager comprising:
   a first photoreceptor comprising a first color-selective doping profile;
   a second photoreceptor comprising a second color-selective doping profile,
   wherein the first color-selective doping profile provides preferential response to a spectrum of light different than the second-color selective doping profile.

26. A solid state imager according to claim 25, further comprising a plurality of additional photoreceptors comprising at least one of the first and second color-selective doping profiles, the additional photoreceptors arranged in a repeating pattern.

27. A solid state imager according to claim 26, wherein the first and second color-selective doping profiles differ in ion implantation.

28. A solid state color imager according to claim 25, wherein at least one of the first and second photoreceptors further comprises a light shield.

29. A solid state color imager according to claim 28, wherein the light shield comprises metalization.

30. A solid state color imager according to claim 28, wherein the light shield comprises polysilicon.

31. A solid state color imager according to claim 28, wherein the first photoreceptor further comprises a light shield, and wherein the first photoreceptor is created in proximity to the second color-selective photoreceptor for collecting electrons diffusing from the second color-selective photoreceptor.

32. A photoreceptor according to claim 1, further comprising an intermediate semiconductor region disposed between the color-selective semiconductor region and the shallow semiconductor region.

33. A photoreceptor according to claim 4, wherein the color-selective semiconductor region is formed on the deep semiconductor region.

34. A solid state color imager according to claim 7, wherein the first color-selective photoreceptor has a first intermediate semiconductor region disposed over the first color selective region and the second color-selective photoreceptor has a second intermediate semiconductor region disposed over the first color selective region.

35. A solid state color imager according to claim 14, wherein the third color-selective photoreceptor has a third intermediate semiconductor region disposed over the third color selective region.

36. A method according to claim 18, wherein creating a first color-selective photoreceptor comprises creating a plurality of first color-selective photoreceptors and creating a second color-selective photoreceptor comprises creating a plurality of second color-selective photoreceptors arranged on a common substrate to form a color imager.

* * * * *